United States Patent
Fujita

(10) Patent No.: US 11,139,809 B2
(45) Date of Patent: Oct. 5, 2021

(54) DRIVING APPARATUS

(71) Applicants: Kabushiki Kaisha Toshiba, Tokyo (JP); Toshiba Electronic Devices & Storage Corporation, Tokyo (JP)

(72) Inventor: Akira Fujita, Yokohama Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 425 days.

(21) Appl. No.: 16/123,741

(22) Filed: Sep. 6, 2018

(65) Prior Publication Data

US 2019/0288676 A1    Sep. 19, 2019

(30) Foreign Application Priority Data

Mar. 16, 2018    (JP) .............................. JP2018-049377

(51) Int. Cl.
| | |
|---|---|
| *H03K 17/082* | (2006.01) |
| *G05F 1/625* | (2006.01) |
| *H02H 9/02* | (2006.01) |
| *H03K 5/22* | (2006.01) |
| *H02P 29/024* | (2016.01) |
| *G01R 19/00* | (2006.01) |

(52) U.S. Cl.
CPC ......... *H03K 17/0822* (2013.01); *G05F 1/625* (2013.01); *H02H 9/025* (2013.01); *G01R 19/0092* (2013.01); *H02P 29/024* (2013.01); *H03K 5/22* (2013.01)

(58) Field of Classification Search
CPC ...... H03K 17/0822; H03K 5/22; G05F 1/625; H02H 9/025; G01R 19/0092; H02P 29/024
See application file for complete search history.

(56) References Cited

U.S. PATENT DOCUMENTS

| | | | |
|---|---|---|---|
| 6,665,599 B2 | 12/2003 | Kogiso et al. | |
| 7,366,599 B2 | 4/2008 | Norito | |
| 8,520,346 B2 | 8/2013 | Ando | |
| 9,018,883 B2 | 4/2015 | Shibataka et al. | |

(Continued)

FOREIGN PATENT DOCUMENTS

| | | |
|---|---|---|
| JP | 2002-193130 A | 7/2002 |
| JP | 2004-210233 A | 7/2004 |

(Continued)

OTHER PUBLICATIONS

Translation of JP2008164519A has been attached.*

(Continued)

*Primary Examiner* — Zoheb S Imtiaz

(57) ABSTRACT

A driving apparatus includes a current output unit, a reference voltage output unit, a comparator, and a drive control unit. The current output unit is switchable to either a first ON resistance or a second ON resistance that is N times (N>1) the first ON resistance. The reference voltage output unit outputs a fist reference voltage during a large current time period, and outputs a second reference voltage that is M times (M>1) the first reference voltage during a small current time period. The drive control unit performs control to perform switching to the first ON resistance during the large current time period, and to perform switching to the second ON resistance during the small current time period.

18 Claims, 5 Drawing Sheets

(56) References Cited

U.S. PATENT DOCUMENTS

| | | | |
|---|---|---|---|
| 9,831,771 | B2 | 11/2017 | Inoue et al. |
| 2002/0084137 | A1* | 7/2002 | Kogiso ................ B62D 5/0463 180/443 |
| 2014/0028234 | A1 | 1/2014 | Lee et al. |
| 2015/0236592 | A1* | 8/2015 | Inoue ..................... H02P 29/68 318/445 |

FOREIGN PATENT DOCUMENTS

| | | | | |
|---|---|---|---|---|
| JP | 2004-229380 | A | | 8/2004 |
| JP | 2008042975 | A | * | 8/2006 |
| JP | 2008164519 | A | * | 12/2006 |
| JP | 2008-42975 | A | | 2/2008 |
| JP | 2008-164519 | A | | 7/2008 |
| JP | 4585358 | B2 | | 11/2010 |
| JP | 2013162568 | A | * | 2/2012 |
| JP | 2013-162568 | A | | 8/2013 |
| JP | 2013-198361 | A | | 9/2013 |
| JP | 2014-027871 | A | | 2/2014 |
| JP | 5641638 | B2 | | 12/2014 |
| JP | 2015-154658 | A | | 8/2015 |

OTHER PUBLICATIONS

Translation of JP2008042975A has been attached.*
Translation of JP2013162568A has been attached.*
Japanese Office Action dated Sep. 29, 2020, with English translation, issued in corresponding Japanese Patent Application No. 2018-049377.

* cited by examiner

FIG. 5A
FIG. 5B
FIG. 5C
FIG. 5D
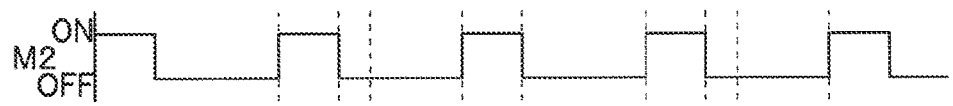
FIG. 5E
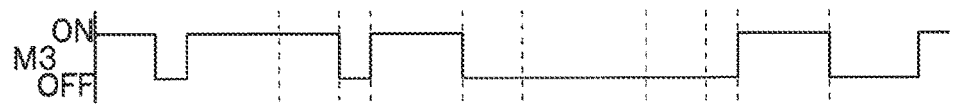
FIG. 5F
FIG. 5G
FIG. 5H
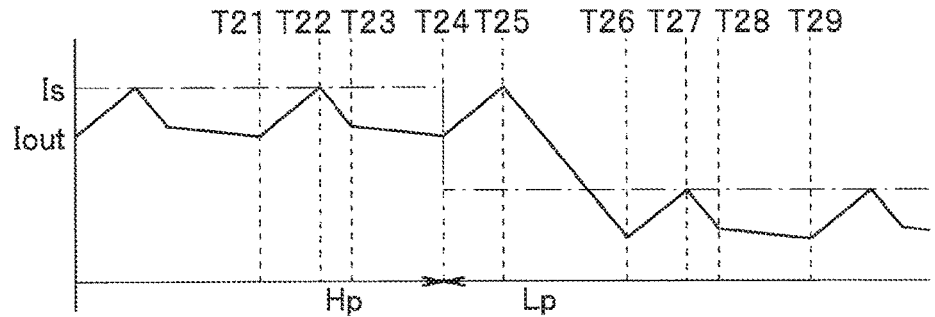
FIG. 5I
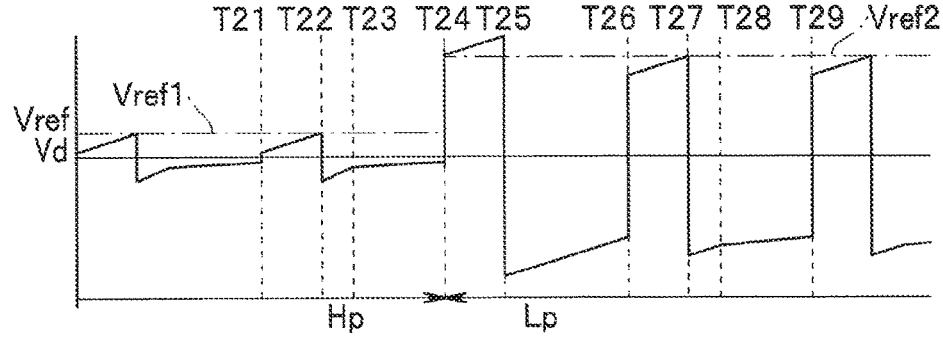

DRIVING APPARATUS

CROSS-REFERENCE TO RELATED APPLICATION

This application is based upon and claims the benefit of priority from the Japanese Patent Application No. 2018-049377 filed on Mar. 16, 2018; the entire contents of which are incorporated herein by reference.

FIELD

Embodiments described herein relate generally to a driving apparatus.

BACKGROUND

There conventionally have been driving apparatuses for driving motors by outputting drive signals. Such a driving apparatus controls a motor by detecting an output current outputted from the motor. For example, the driving apparatus detects the voltage of a bridge circuit that is driving the motor, compares a detected voltage with a reference voltage by using a comparator, performs control such that the output current does not exceed a current set value, and outputs the output current having a waveform corresponding to the current set value.

In a time period when the current set value is to be low, both the detected voltage and the reference voltage are lowered, so that the comparator may fail to accurately detect the output current. If the accuracy of detecting the output current is deteriorated, the driving apparatus may cause a disturbance of the waveform of the output current and may deteriorate the accuracy of driving the motor.

BRIEF DESCRIPTION OF THE DRAWINGS

FIG. 5A is a diagram showing one example of an operation of a transistor of the driving apparatus according to a second embodiment;

FIG. 5B is a diagram showing one example of an operation of a transistor of the driving apparatus according to the second embodiment;

FIG. 5C is a diagram showing one example of an operation of a transistor of the driving apparatus according to the second embodiment;

FIG. 5D is a diagram showing one example of an operation of a transistor of the driving apparatus according to the second embodiment;

FIG. 5E is a diagram showing one example of an operation of a transistor of the driving apparatus according to the second embodiment;

FIG. 5F is a diagram showing one example of an operation of a transistor of the driving apparatus according to the second embodiment;

FIG. 5G is a diagram showing one example of an operation of a transistor of the driving apparatus according to the second embodiment;

FIG. 5H is a diagram showing one example of an operation of a transistor of the driving apparatus according to the second embodiment; and FIG. 5I is a diagram showing one example of an operation of a transistor of the driving apparatus according to the second embodiment.

DETAILED DESCRIPTION

A driving apparatus includes a current output unit, a reference voltage output unit, a comparator, and a drive control unit. The current output unit is switchable to either a first ON resistance or a second ON resistance that is N times (N>1) the first ON resistance, and outputs an output current to a load device. In a large current time period that is a time period during which the current set value is set to be equal to or greater than a predetermined value, the reference voltage output unit outputs a first reference voltage which is determined according to a current set value, and in a small current time period that is a time period during which the current set value is set to be less than the predetermined value, the reference voltage output unit outputs a second reference voltage that is M times (M>1) the first reference voltage. The comparator compares a detected voltage detected from the current output unit with the first or second reference voltage, and outputs a predetermined feedback signal. The drive control unit controls the current output unit to decrease the output current according to the predetermined feedback signal by switching the current output unit to the first ON resistance in the large current time period, and by switching the current output unit to the second ON resistance in the small current time period.

Hereinafter, embodiments are described with reference to the drawings.

Configuration of First Embodiment

Figure 1:
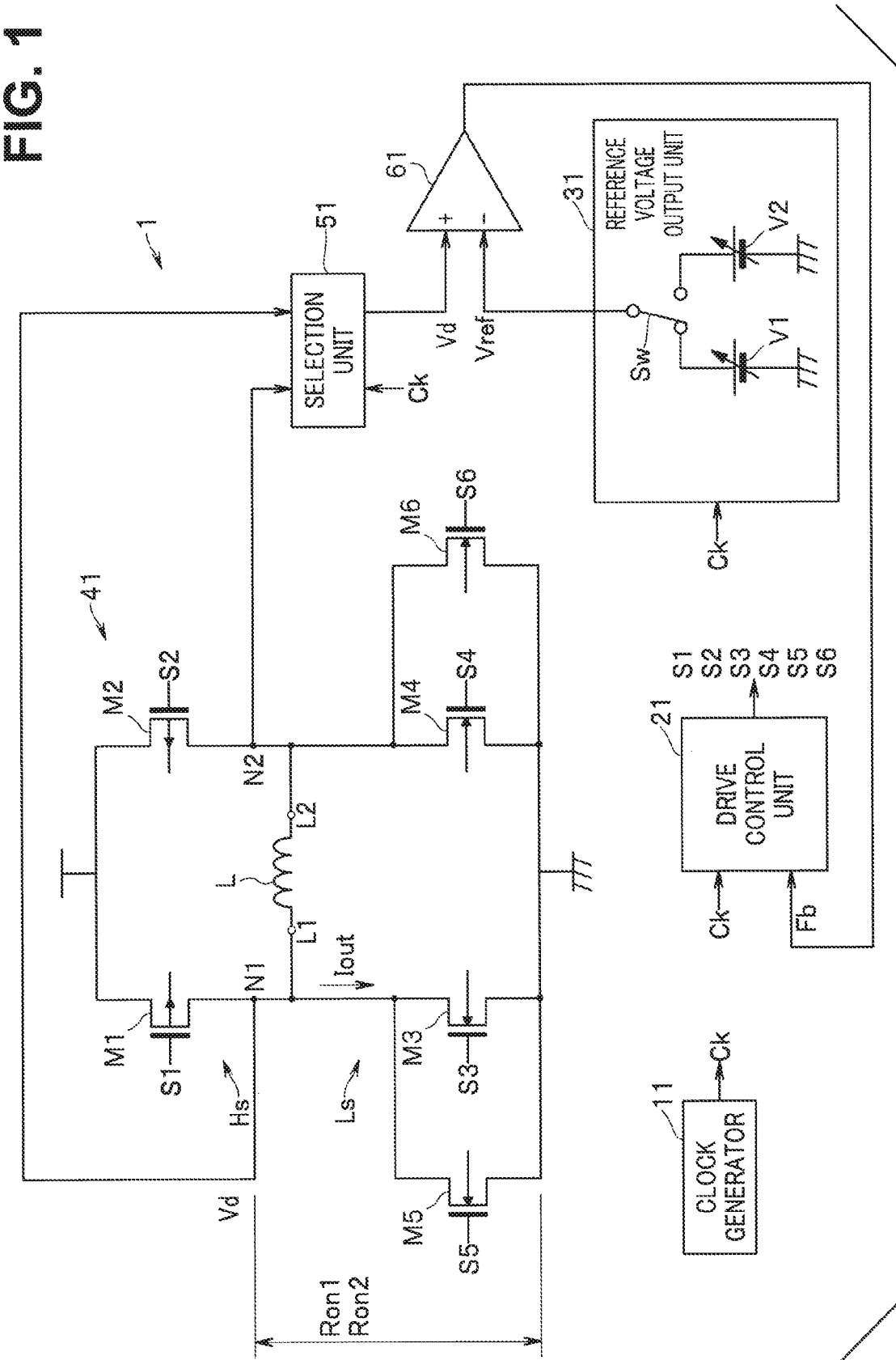
FIG. 1 is a circuit diagram illustrating one example of the configuration of a driving apparatus according to a first embodiment.

FIG. 1 is a circuit diagram illustrating one example of the configuration of a driving apparatus 1 according to a first embodiment. The driving apparatus 1 in FIG. 1 includes a clock generator 11, a drive control unit 21, a reference voltage output unit 31, a current output unit 41, a selection unit 51, and a comparator 61. The current output unit 41 is connected to a load device L, and outputs an output current Iout to drive the load device L. The load device L is a motor, for example.

The clock generator 11 is a circuit that generates a predetermined clock signal Ck. The clock generator 11 outputs the clock signal Ck to the drive control unit 21, the reference voltage output unit 31, and the selection unit 51. The drive control unit 21, the reference voltage output unit 31, and the selection unit 51 each perform a predetermined time detection process of detecting various times in accordance with a count value obtained by counting the clock signal Ck.

The drive control unit 21 is a circuit that generates control signals S1 to S6 in accordance with the clock signal Ck and a predetermined feedback signal Fb fed back from the comparator 61, outputs the control signals 5I to S6 to the current output unit 41, and thereby controls the current output unit 41. Hereinafter, all or some of the control signals S1 to S6 are referred to as a control signal S.

When detecting a charging start time through the predetermined time detection process, the drive control unit 21 controls the current output unit 41 to carry out charging by applying a voltage supplied from a power source to the load device L. More specifically, when the current set value Is is a positive value, the drive control unit 21 controls the current output unit 41 such that one connection end L1, which is for connection with the load device L, is connected to a ground and the other connection end L2 is connected to the power source. When the current set value Is is a negative value, the drive control unit 21 controls the current output unit 41 such that the connection end L1 is connected to the power source and the connection end L2 is connected to the ground. The current set value Is is set in advance for each predetermined time period. The charging start time is set in advance such that charging is started on a predetermined cycle.

Further, when the predetermined feedback signal Fb indicating that the output current Iout has become the current set value Is or greater is inputted to the drive control unit 21, the drive control unit 21 performs control to start decay of decreasing the output current Iout. More specifically, according to the input of the predetermined feedback signal Fb fed back from the comparator 61, the drive control unit 21 switches the application direction of the voltage to the load device L to the reversed direction so as to control the current output unit 41 to carry out fast decay of regenerating the output current Iout into the power source and the ground.

Moreover, when detecting that the time is within a large current time period Hp through the predetermined time detection process, the drive control unit 21 switches a low-side switch part Ls of the current output unit 41 to a first ON resistance Ron1. When detecting that the time is within a small current time period Lp, the drive control unit 21 switches the low-side switch part Ls to a second ON resistance Ron2.

The first ON resistance Ron1 is empirically or experimentally set in advance such that when a detected voltage Vd, which is calculated by multiplying the first ON resistance Ron1 by the output current Iout, becomes a predetermined voltage or higher, the first ON resistance Ron1 can be accurately compared with the reference voltage Vref by the comparator 61. The second ON resistance Ron2 is set in advance to N times (N>1) the first ON resistance Ron1.

That is, the drive control unit 21 controls the current output unit 41 to start the decay by performing switching to the first ON resistance Ron1 when detecting that the large current time period Hp has come, and by performing switching to the second ON resistance Ron2 when detecting that the small current time period Lp has come. In the large current time period Hp, the absolute value of the current set value Is is equal to or greater than a predetermined value. In the small current time period Lp, the absolute value of the current set value Is is lower than the predetermined value. The large current time period Hp and the small current time period Lp are set in advance so as to be alternately switched.

The reference voltage output unit 31 is connected to an inverted terminal of the comparator 61, and is a circuit that outputs a reference voltage Vref to the comparator 61. The reference voltage Vref is outputted according to the current set value Is. The reference voltage output unit 31 includes a power source V1, a power source V2, and a switch Sw. The power source V1 and the power source V2 each have one end connected to the switch Sw and the other end connected to the ground.

The switch Sw connects the comparator 61 to either the power source V1 or the power source V2. When detecting that the time is within the large current time period Hp, the switch Sw connects the comparator 61 to the power source V1. When detecting that the time is within the small current time period Lp, the switch Sw connects the comparator 61 to the power source V2.

Figure 2:
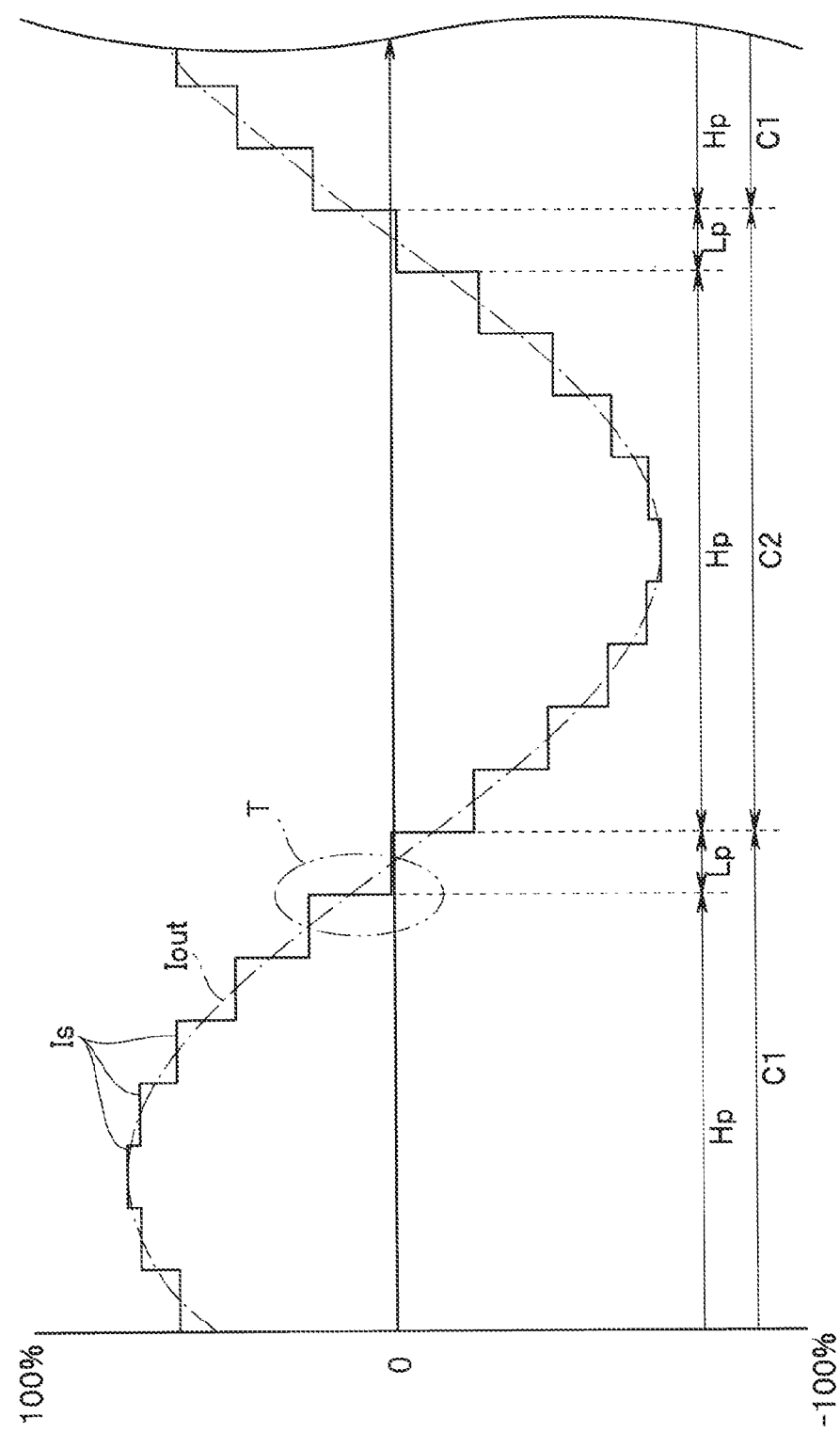
FIG. 2 is a diagram showing one example of a current set value and the waveform of an output current of the driving apparatus according to the first embodiment.

FIG. 2 is a diagram showing one example of the current set value Is and the waveform of the output current Iout according to the first embodiment. The vertical axis represents a current and the horizontal axis represents a time. In the example in FIG. 2, the current set value Is which stepwisely changes along a sine wave is set to approximate the waveform of the output current Iout to the sine wave. The current set value Is is set in advance for each predetermined time period such that the output current Iout forms a predetermined waveform. The predetermined time period is defined on the basis of the clock signal Ck. In a first connection time period C1, the current set value Is is a positive value. In a second connection time period C2, the current set value Is is a negative value.

At the center portion, in the horizontal axis direction, of each of the mountain portion and the valley portion of the sin wave, the absolute value of the current set value Is is set to a relatively great value such that the output current Iout becomes large. In the vicinity of the boundary between the mountain portion and the valley portion of the sine wave, the absolute value of the current set value Is is set to a relatively small value such that the output current Iout becomes small.

The power source V1 outputs a first reference voltage Vref1 in the large current time period Hp, as shown in equation (1) below. In equation (1), Vref(V1) represents the first reference voltage Vref1, Is(ck) represents the current set value Is that is defined by a function of the count value obtained by counting the clock signals Ck, and k represents a predetermined coefficient.

$$V\text{ref}(V)=Is(ck){\times}k \qquad (1)$$

The power source V2 outputs a second reference voltage Vref2 obtained by multiplying, by N (N>), the first reference voltage Vref1 determined according to the current set value Is, in the small current time period Lp, as shown in equation (2). In equation (2), Vref(V2) represents the second reference voltage Vref2.

$$V\text{ref}(V2)=Is(ck){\times}k{\times}N \qquad (2)$$

That is, when detecting that the large current time period Hp has come, the reference voltage output unit 31 outputs the first reference voltage Vref1. When detecting that the small current time period Lp has come, the reference voltage output unit 31 outputs the second reference voltage Vref2.

Note that, description is made here on the example in which the second reference voltage Vref2 is N times the first reference voltage Vref1. However, the second reference voltage Vref2 is not necessarily N times the first reference voltage. For example, the second reference voltage Vref2 may be M times (M>1) the first reference voltage Vref1, which is set so as to be able to be compared with the detected voltage Vd by the comparator 61 in the small current time period Lp. N and M are preferably the values close to each other. More preferably, N and M have the same value.

In addition, N and M are the numbers larger than 1, and may include a decimal fraction.

The current output unit 41 is a circuit that outputs the output current Iout to the load device L in accordance with the control signal S inputted from the drive control unit 21. The current output unit 41 includes transistors M1 to M6.

Respective gates of the transistors M1 to M6 are connected to the drive control unit 21. The control signal 5I is inputted to the gate of the transistor M1, the control signal S2 is inputted to the gate of the transistor M2, the control signal S3 is inputted to the gate of the transistor M3, the control signal S4 is inputted to the gate of the transistor M4, the control signal S5 is inputted to the gate of the transistor M5, and the control signal S6 is inputted to the gate of the transistor M6.

The transistors M1, M2 are each formed of a p-type MOSFET, for example. Respective sources of the transistors M1, M2 are connected to a power source. The drain of the transistor M1 is connected to the connection end L1. The drain of the transistor M2 is connected to the connection end L2. Each of the transistors M1, M2 constitutes a high-side switch part Hs disposed on the high side of the current output unit 41.

Each of the transistors M3 to M6 is formed of an n-type MOSFET, for example. Respective sources of the transistors M3 to M6 are connected to the ground. Respective drains of the transistors M3, M5 are connected to the connection end L1, and the drains of the transistors M4, M6 are connected to the connection end L2. Each of the transistors M3 to M6 constitutes a low-side switch part Ls disposed on the low side of the current output unit 41.

The transistors M3, M4 as first switching transistors each have a first ON resistance Ron1. The transistors M5, M6 as second switching transistors each have a second ON resistance Ron2.

The size ratio between the transistors M3, M5 in the layout configuration is set in advance to M3:M5=N:1 such that the ratio between the first ON resistance Ron1 at the transistor M3 and the second ON resistance Ron2 at the transistor M5 is M3:M5=1:N. Likewise, the size ratio between the transistors M4, M6 in the layout configuration is set in advance to M4:M6=N:1 such that the ratio between the first ON resistance Ron1 at the transistor M4 and the second ON resistance Ron2 at the transistor M6 is M4:M6=1:N.

Figure 3:
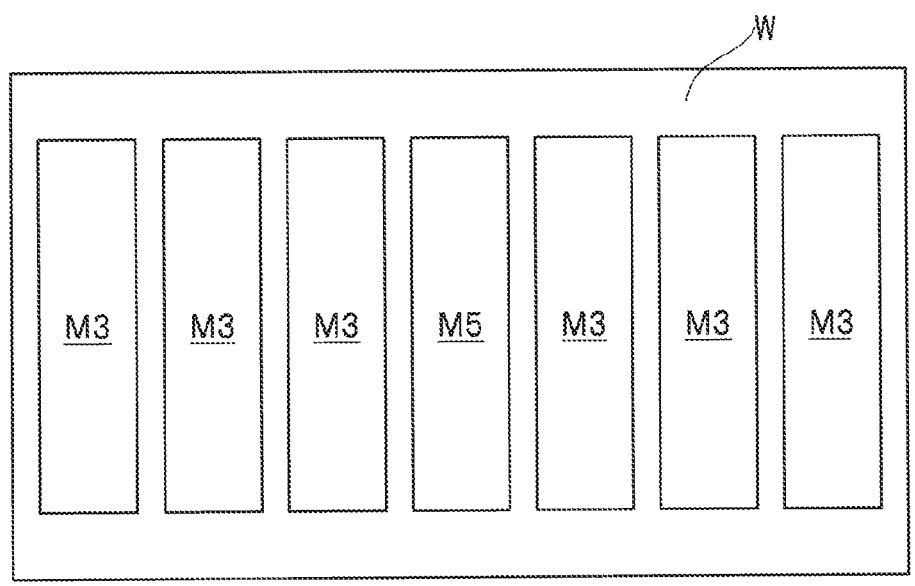
FIG. 3 is a diagram for explaining one example of the layout configuration of transistors in a current output unit of the driving apparatus according to the first embodiment.

FIG. 3 is a diagram for explaining one example of the layout configuration of the transistors M3, M5 according to the first embodiment. In order to achieve downsizing of the transistors M3, M5 in the layout configuration and to improve the thermal coupling performance between the transistors M3, M5, the transistor M5 is desirably disposed on the center of one well W while the transistors M3 are disposed equally on both sides of the transistor M5 in the one well W. Likewise, regarding the transistors M4, M6, the transistor M6 is desirably disposed on the center of one well W while the transistors M4 are equally disposed on both sides of the transistor M6 in the one well W, although an illustration of the transistors M4, M6 is omitted here.

A first output end N1 is disposed between the drain of the transistor M1 and the drains of the transistors M3, M5. A second output end N2 is disposed between the drains of the transistor M2 and the drains of the transistors M4, M6. Each of the first output end N1 and the second output end N2 is connected to the selection unit 51. That is, the detected voltage Vd is detected at each of the connection end L1 and the connection end L2.

That is, the current output unit 41 is switchable to either the first ON resistance Ron1 or the second ON resistance Ron2, and outputs the output current Iout to the load device L. More specifically, the current output unit 41 can switch the low-side switch part Ls to either the first ON resistance Ron1 or the second ON resistance Ron2. The detected voltage Vd is detected between the high-side switch part Hs and the low-side switch part Ls. The current output unit 41 includes the first switching transistors having the first ON resistance Ron1 and the second switching transistors having the second ON resistance Ron2 and being connected in parallel with the first switching transistors. The first and second switching transistors are desirably disposed in one well W.

The selection unit 51 is a circuit that outputs, to the non-inverted terminal of the comparator 61, the detected voltage Vd inputted from either the first output end N1 or the second output end N2. When detecting that the time is within the first connection time period C1, the selection unit 51 connects the first output end N1 to the non-inverted terminal. When detecting that the time is within the second connection time period C2, the selection unit 51 connects the second output end N2 to the non-inverted terminal.

Connection of the selection unit 51 is switched to either the connection end L1 or the connection end L2 such that the detected voltage Vd becomes a positive value, and outputs the detected voltage Vd to the comparator 61.

The comparator 61 compares the reference voltage Vref inputted to the inverted terminal from the reference voltage output unit 31 with the detected voltage Vd inputted to the non-inverted terminal. When the detected voltage Vd becomes the reference voltage Vref or higher, the comparator 61 outputs the predetermined feedback signal Fb to the drive control unit 21.

(Operation)

Next, in the driving apparatus 1 according to the first embodiment, one example of operation of in a switching time period T (the two-dot chain line in FIG. 2) of the first connection time period C1 is described. In the switching time period T, the current set value Is is a positive value, and the large current time period Hp is switched to the small current time period Lp.

Figure 4A:
FIG. 4A is a diagram showing one example of an operation of a transistor of the driving apparatus according to the first embodiment.
Figure 4B:
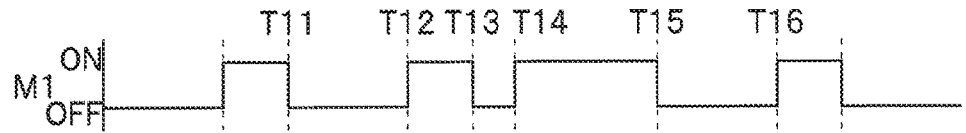
FIG. 4B is a diagram showing one example of an operation of a transistor of the driving apparatus according to the first embodiment.
Figure 4C:
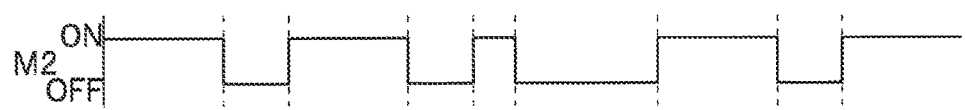
FIG. 4C is a diagram showing one example of an operation of a transistor of the driving apparatus according to the first embodiment.
Figure 4D:
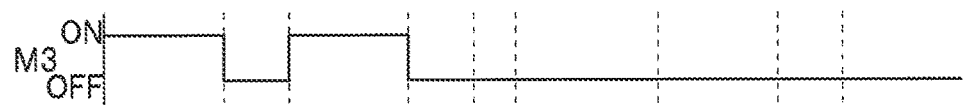
FIG. 4D is a diagram showing one example of an operation of a transistor of the driving apparatus according to the first embodiment.
Figure 4E:
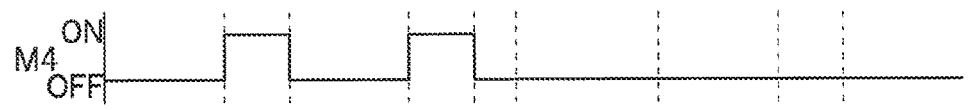
FIG. 4E is a diagram showing one example of an operation of a transistor of the driving apparatus according to the first embodiment.
Figure 4F:
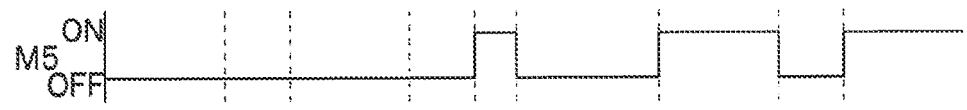
FIG. 4F is a diagram showing one example of an operation of a transistor of the driving apparatus according to the first embodiment.
Figure 4G:
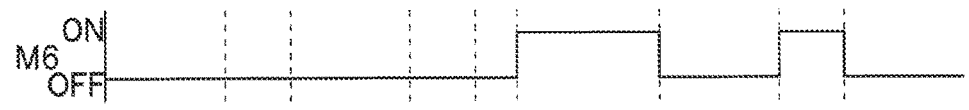
FIG. 4G is a diagram showing one example of an operation of a transistor of the driving apparatus according to the first embodiment.

FIGS. 4A to 4I are diagrams showing one example of operation of the transistors M1 to M6 of the driving apparatus 1 according to the first embodiment. FIG. 4A shows the waveform of the clock signal Ck. The clock generator 11 outputs the clock signal Ck the level of which repeats an H level and an L level on a predetermined cycle, to the drive control unit 21, the reference voltage output unit 31, and the selection unit 51.

FIGS. 4B to 4G show operation of the transistors M1 to M6, respectively. When the charging start time comes at T11, the drive control unit 21 outputs the control signal S2 of the L level and the control signal S3 of the H level, so that the transistors M2, M3 are ON. The drive control unit 21 outputs the control signal 5I of the H level and the control signals S4, S5, S6 of the L level so that the transistors M1, M4, M5, M6 are OFF.

Figure 4H:
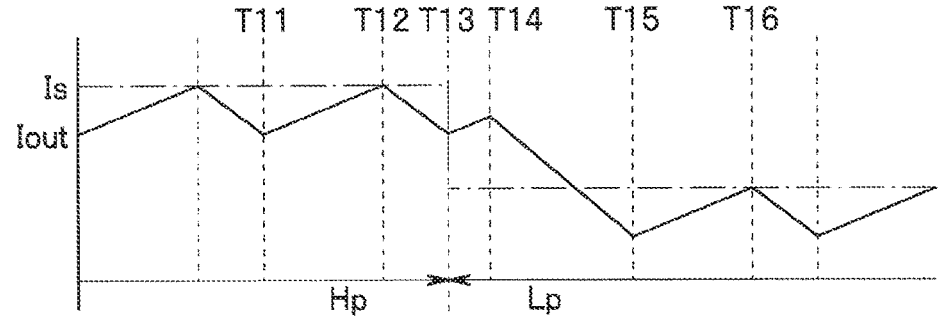
FIG. 4H is a diagram showing one example of an operation of a transistor of the driving apparatus according to the first embodiment.

When the transistors M2, M3 are ON, the connection end L1 is connected to the ground and the connection end L2 is connected to the power source. The output current Iout flows from the connection end L2 to the connection end L1. The low-side switch part Ls has the first ON resistance Ron1 through the transistor M3. As expressed by Vd=Iout×Ron1, the output current Iout is increased with increase of the detected voltage Vd (FIGS. 4H, 4I).

Figure 4I:
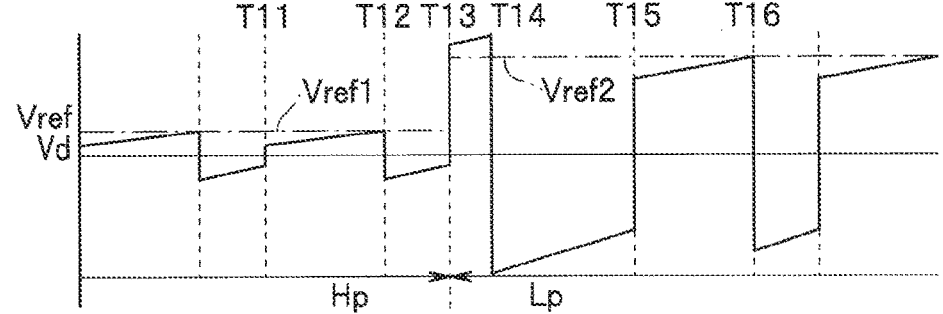
FIG. 4I is a diagram showing one example of an operation of a transistor of the driving apparatus according to the first embodiment.

In FIG. 4IH, the output current Iout is indicated by a solid line, and the current set value Is is indicated by a one-dot chain line. In FIG. 4I, the detected voltage Vd is indicated by a solid line, and the reference voltage Vref is indicated by a one-dot chain line.

The reference voltage output unit 31 connects the power source V1 to the inverted terminal of the comparator 61 by using the switch Sw, and outputs the first reference voltage Vref1 to the comparator 61.

Only during a charging time period in the first connection time period C, the selection unit 51 outputs the detected voltage Vd inputted from the first output end N1 to the comparator 61. During the decay time period in the first connection time period C1, the selection unit 51 outputs the detected voltage Vd inputted from the second output end N2 to the comparator 61.

When the detected voltage Vd becomes the first reference voltage Vref1 or higher at T12, the comparator 61 outputs the predetermined feedback signal Fb. The drive control unit 21 outputs the control signal S so that the transistors M1, M4 are ON and the transistors M2, M3, M5, M6 are OFF. When the transistors M1, M4 are ON, the connection end L is connected to the power source and the connection end L2 is connected to the ground. When the positive/negative sign of the detected voltage Vd is inverted, the output current Iout is decreased.

When the small current time period Lp comes at T13, the drive control unit 21 outputs the control signal S so that the transistors M2, M5 are ON and the transistors M1, M3, M4, M6 are OFF. When the low-side switch part Ls has the second ON resistance Ron2 as a result of switching from the transistor M3 to the transistor M5, the detected voltage Vd is increased N times.

When the small current time period Lp comes, the reference voltage output unit 31 cancels connection with the power source V1 by driving the switch Sw, and connects the power source V2 to the comparator 61. The reference voltage output unit 31 outputs the second reference voltage Vref2 to the comparator 61.

When the detected voltage Vd is higher than the second reference voltage Vref2 at T14, the comparator 61 outputs the predetermined feedback signal Fb. The drive control unit 21 outputs the control signal S so that the transistors M, M6 are ON and the transistors M2, M3, M4, M5 are OFF. The output current Iout is decreased.

When the charging start time comes at T15, the drive control unit 21 outputs the control signal S so that the transistors M2, M5 are ON and the transistors M1, M3, M4, M6 are OFF. The output current Iout is increased.

When the detected voltage Vd becomes higher than the reference voltage Vref at T16, the comparator 61 outputs the predetermined feedback signal Fb.

As a result, when the small current time period Lp comes, the low-side switch part Ls is switched from the first ON resistance Ron1 to the second ON resistance Ron2, and the detected voltage Vd to be inputted to the comparator 61 is increased N times. The reference voltage output unit 31 increases, N times, the reference voltage Vref to be inputted to the comparator 61 upon switching from the power source V1 to the power source V2. Consequently, the driving apparatus 1 can more accurately compare the detected voltage Vd with the reference voltage Vref during the small current time period Lp by using the comparator 61 so as to control the output current Iout according to the current set value Is.

According to the embodiment, even in a time period when the current set value Is is set to be low, the driving apparatus 1 can more accurately detect the output current Iout and drive the load device L.

Second Embodiment

In the first embodiment, the drive control unit 21 decreases the output current Iout through the fast decay. However, the decay may be carried out through the fast decay of regenerating the output current Iout into the power source and slow decay of causing the output current Iout to circulate within the circuit.

FIGS. 5A to 5I are diagrams showing one example of operation of the transistors M1 to M6 of the driving apparatus 1 according to the second embodiment. FIGS. SA to 5I show one example of operation during the switching time period T (the two-dot chain line in FIG. 2) in the first connection time period C1 as FIGS. 4A to 4I do. In the present embodiment, an explanation of components identical to the components of the other embodiment is omitted.

When the charging start time comes at T21, the drive control unit 21 outputs the control signal S so that the transistors M2, M3 are ON and the transistors M1, M4, M5, M6 are OFF. When the transistors M2, M3 are ON, the output current Iout is increased (FIG. 5H).

The reference voltage output unit 31 outputs the first reference voltage Vref1 to the comparator 61. Only during the charging time period in the first connection time period C1, the selection unit 51 outputs the detected voltage Vd inputted from the first output end N1 to the comparator 61. During the decay time period in the first connection time period C1, the selection unit 51 outputs the detected voltage Vd inputted from the second output end N2 to the comparator 61.

When the detected voltage Vd becomes the first reference voltage Vref1 or higher at T22, the comparator 61 outputs the predetermined feedback signal Fb. The drive control unit 21 outputs the control signal S so that the transistors M1, M4 are ON and the transistors M2, M3, M5, M6 are OFF. When the transistors M1, M4 are ON, the fast decay is carried out to regenerate the output current Iout into the power source and the ground. Thus, the output current Iout is quickly decreased.

When a slow decay start time comes at 123, the drive control unit 21 outputs the control signal S so that the transistors M3, M4 are ON and the transistors M1, M2, M5, M6 are OFF. When the transistors M3, M4 are ON, the slow decay is carried out to cause the output current Iout to circulate in the low-side switch part Ls. Thus, the output current Iout is gradually decreased.

When the small current time period Lp comes at T24, the drive control unit 21 outputs the control signal S so that the transistors M2, M5 are ON and the transistors M1, M3, M4, M6 are OFF. The reference voltage output unit 31 connects the power source V2 to the comparator 61 by using the switch Sw, and outputs the second reference voltage Vref2 to the comparator 61.

When the detected voltage Vd is higher than the second reference voltage Vref at T25, the comparator 61 outputs the predetermined feedback signal Fb. The drive control unit 21 outputs the control signal S so that the transistors M1, M6 are ON and the transistors M2, M3, M4, M5 are OFF. The output current Iout is quickly decreased by the fast decay.

When the charging start time comes at T26, the drive control unit 21 outputs the control signal S so that the transistors M2, M5 are ON, and the transistors M1, M3, M4, M6 are OFF. The output current Iout is increased.

When the detected voltage Vd becomes higher than the second reference voltage Vref2 at T27, the comparator 61 outputs the predetermined feedback signal Fb. The output current Iout is quickly decreased by the fast decay.

When the slow decay start time comes at T28, the output current Iout is gradually decreased by the slow decay. When the charging start time comes at T29, the drive control unit 21 outputs the control signal S so that the transistors M2. M5 are ON and the transistors M1, M3, M4, M6 are OFF. The output current Iout is increased.

Accordingly, when decreasing the output current Iout, the driving apparatus 1 can suppress a current ripple by performing switching between the fast decay and the slow decay.

According to the embodiment, the driving apparatus 1 can suppress a current ripple, can highly accurately detect the output current Iout even in a time period when the current set value Is is set to be low, and can drive the load device L.

In each of the embodiments, the drive control unit 21 keeps the transistors M5, M6 OFF during the large current time period Hp. However, the drive control unit 21 may perform control such that when the transistor M3 is ON, the transistor M5 is also ON, and when the transistor M4 is ON, the transistor M6 is also ON. That is, the drive control unit 21 keeps the second switching transistors OFF during the large current time period Hp in the embodiment, but the drive control unit 21 may make the operation of the second switching transistors the same as the operation of the first switching transistors.

In each of the embodiments, the configuration in which the low-side switch part Is is switched to either the first ON resistance Ron1 or the second ON resistance Ron2 in the small current time period Lp has been described. Alternatively, a configuration in which the high-side switch part Hs is switched to either the first ON resistance Ron1 or the second ON resistance Ron2 may be adopted. That is, the current output unit 41 includes the high-side switch part Hs and the low-side switch part Ls, and either the high-side switch part Hs or the low-side switch part Ls can be switched to either the first ON resistance Ron1 or the second ON resistance Ron2.

In each of the embodiments, the current set value Is is set along a sign wave. However, the wave along which the current set value Is is set is not limited to a sign wave. For example, the current set value Is may be set along a triangular wave, or along a sawtooth wave.

In the second embodiment, the slow decay is carried out in the low-side switch part Ls. Alternatively, the slow decay may be carried out in the high-side switch part Hs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A driving apparatus comprising:
   a current output unit which is switchable to either a first ON resistance or a second ON resistance that is N times (N>1) the first ON resistance and which is configured to output an output current to a load device;
   a reference voltage output unit configured to output a first reference voltage which is determined according to a current set value in a large current time period, and to output a second reference voltage that is M times (M>1) the first reference voltage in a small current time period, the large current time period being a time period during which the current set value is set to be equal to or greater than a predetermined value, the small current time period being a time period during which the current set value is set to be less than the predetermined value;
   a comparator configured to compare a detected voltage detected from the current output unit with the first or second reference voltage and output a predetermined feedback signal;
   a drive control unit configured to control the current output unit to decrease the output current according to the predetermined feedback signal by switching the current output unit to the first ON resistance in the large current time period, and by switching the current output unit to the second ON resistance in the small current time period; and
   a clock generator configured to generate a clock signal, wherein the drive control unit detects the large current time period and the small current time period in accordance with a count, value obtained by counting the clock signal.

2. The driving apparatus according to claim 1, the apparatus further comprising a selection unit, wherein the detected voltage is detected from one connection end and the other connection end of the load device, and the selection unit switches connection to either the one connection end or the other connection end such that the detected voltage becomes a positive value, and outputs the detected voltage to the comparator.

3. The driving apparatus according to claim 1, wherein the current output unit includes a high-side switch part and a low-side switch part, and either the high-side switch part or the low-side switch part can be switched to either the first ON resistance or the second ON resistance.

4. The driving apparatus according to claim 3, wherein the current output unit can switch the low-side switch part to either the first ON resistance or the second ON resistance, and the detected voltage is detected between the high-side switch part and the low-side switch part.

5. The driving apparatus according to claim 1, wherein the drive control unit carries out the decay through fast decay of regenerating the output current into a power source and a ground, and through slow decay of causing the output current to circulate in the current output unit.

6. The driving apparatus according to claim 3, wherein the current output unit includes a first switching transistor having the first ON resistance and a second switching transistor having the second ON resistance and being connected in parallel with the first switching transistor.

7. The driving apparatus according to claim 6, wherein the drive control unit keeps the second switching transistor OFF during the large current time period.

8. The driving apparatus according to claim 1, wherein the reference voltage output unit detects the large current time period and the small current time period in accordance with the count value.

9. A driving apparatus comprising:
- a current output unit which is switchable to either a first ON resistance or a second ON resistance that is N times (N>1) the first ON resistance and which is configured to output an output current to a load device, wherein the current output unit comprises:
  - a high-side switch part and a low-side switch part, and either the high-side switch part or the low-side switch part can be switched to either the first ON resistance or the second ON resistance, and
  - a first switching transistor having the first ON resistance and a second switching transistor having the second ON resistance and being connected in parallel with the first switching transistor;
- a reference voltage output unit configured to output a first reference voltage Which is determined according to a current set value in a large current time period, and to output a second reference voltage that is M times (M>1) the first reference voltage in a small current time period, the large current time period being a time period during which the current set value is set to be equal to or greater than a predetermined value, the small current time period being a time period during which the current set value is set to be less than the predetermined value:
- a comparator configured to compare a detected voltage detected from the current output unit with the first or second reference voltage and output a predetermined feedback signal; and
- a drive control unit configured to control the current output unit to decrease the output current according to the predetermined feedback signal by switching the current output unit to the first resistance in the large current time period, and by switching the current output unit to the second ON resistance in the small current time period,
- wherein the low-side switch part further includes a third switching transistor having the first ON resistance and a fourth switching transistor having the second ON resistance,
- respective gates of the first switching transistor, the second switching transistor, the third switching transistor, and the fourth switching transistor are connected to the drive control unit, and respective sources of the first switching transistor, the second switching transistor, the third switching transistor, and the fourth switching transistor are connected to a ground,
- respective drains of the first switching transistor and the second switching transistor are connected to a first connection end of the load device, and
- respective drains of the third switching transistor and the fourth switching transistor are connected to a second connection end of the load device.

10. The driving apparatus according to claim 9, wherein the high-side switch part includes a first high-side transistor and a second high-side transistor, the first high-side transistor and the second high-side transistor are configured to each have a polarity different from polarities of the first switching transistor, the second switching transistor, the third switching transistor and the fourth switching transistor, respective gates of the first high-side transistor and the second high-side transistor are connected to the drive control unit, and respective sources of the first high-side transistor and the second high-side transistor are connected to a power source, a drain of the first high-side transistor is connected to the first connection end, and a drain of the second high-side transistor is connected to the second connection end.

11. The driving apparatus according to claim 1, wherein the N and the M have a same value.

12. The driving apparatus according to claim 9, the apparatus further comprising a selection unit, wherein the detected voltage is detected from one connection end and the other connection end of the load device, and the selection unit switches connection to either the one connection end or the other connection end such that the detected voltage becomes a positive value, and outputs the detected voltage to the comparator.

13. The driving apparatus according to claim 9, wherein the current output unit can switch the low-side switch part to either the first ON resistance or the second ON resistance, and the detected voltage is detected between the high-side switch part and the low-side switch part.

14. The driving apparatus according to claim 9, wherein the drive control unit carries out the decay through fast decay of regenerating the output current into a power source and a ground, and through slow decay of causing the output current to circulate in the current output unit.

15. The driving apparatus according to claim 9, wherein the drive control unit keeps the second switching transistor and the fourth switching transistor OFF during the large current time period.

16. The driving apparatus according to claim 9, the apparatus further comprising a clock generator configured to generate a clock signal, wherein the drive control unit detects the large current time period and the small current time period in accordance with a count value obtained by counting the clock signal.

17. The driving apparatus according to claim 9, wherein the reference voltage output unit detects the large current time period and the small current time period in accordance with the count value.

18. The driving apparatus according to claim 9, wherein the N and the M have a same value.

* * * * *